United States Patent
Johnson et al.

(10) Patent No.: US 7,569,862 B2
(45) Date of Patent: Aug. 4, 2009

(54) SEMICONDUCTOR LIGHT-EMITTING DEVICE AND A METHOD OF MANUFACTURE THEREOF

(75) Inventors: Katherine L. Johnson, Oxford (GB);
Stewart Hooper, Oxfordshire (GB);
Valerie Bousquet, Oxford (GB);
Matthias Kauer, Oxford (GB);
Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 426 days.

(21) Appl. No.: 11/030,791

(22) Filed: Jan. 7, 2005

(65) Prior Publication Data

US 2005/0249253 A1 Nov. 10, 2005

(30) Foreign Application Priority Data

Jan. 9, 2004 (GB) .................... 0400364.6

(51) Int. Cl.
*H01L 33/00* (2006.01)
(52) U.S. Cl. .................... 257/94; 257/12; 257/79; 257/E33.027; 257/E33.028; 257/E33.034; 372/43.01; 372/46.013
(58) Field of Classification Search .......... 438/40; 372/46, 46.013, 43.01; 257/14, 12, 94, 13, 257/79, E33.028, E33.027, E33.034
See application file for complete search history.

(56) References Cited

U.S. PATENT DOCUMENTS 6,727,112 B2 * 4/2004 Wang et al. ............... 438/40

2002/0048835 A1 * 4/2002 Kwak ...................... 438/46
2002/0110945 A1 * 8/2002 Kuramata et al. .......... 438/36
2003/0169795 A1 * 9/2003 Otoma et al. .............. 372/46

OTHER PUBLICATIONS

Takashi Mukai, Recent Progress in Group-III Nitride Light-Emitting Diodes, Mar./Apr. 2002, IDDD Journal on Selected Topics in Quantum Electronics, vol. 8, No. 2, pp. 264-270.*

* cited by examiner

*Primary Examiner*—Kiesha L Rose
*Assistant Examiner*—Minchul Yang
(74) *Attorney, Agent, or Firm*—Renner, Otto, Boisselle & Sklar, LLP (57) ABSTRACT

A method of manufacturing a semiconductor light-emitting device comprises selectively etching a semiconductor layer structure (16) fabricated in a nitride materials system and including an aluminum-containing cladding region or an aluminum-containing optical guiding region (5). The etching step forms a mesa (17), and also exposes one or more portions of the aluminum-containing cladding region or the aluminum-containing optical guiding region (5). The or each exposed portion of the aluminum-containing cladding region or the aluminum-containing optical guiding region (5) is then oxidized to form a current blocking layer (18) laterally adjacent to and extending laterally from the mesa. When an electrically conductive contact layer (11) is deposited, the current blocking layer (18) will prevent the contact layer (11) from making direct contact with the buffer layer (3).

9 Claims, 6 Drawing Sheets

SEMICONDUCTOR LIGHT-EMITTING DEVICE AND A METHOD OF MANUFACTURE THEREOF

FIELD OF THE INVENTION

The present invention relates to manufacture of a semiconductor light-emitting device such as, for example, a semiconductor laser device. The invention may particularly, but not exclusively, be applied to fabrication of a device in the (Al,Ga,In)N materials system.

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminium, gallium and indium will be referred to as AlGaInN, a member that has a zero aluminium mole fraction but that has non-zero mole fractions of gallium and indium will be referred to as InGaN, a member that has a zero indium mole fraction but that has non-zero mole fractions of gallium and aluminium will be referred to as AlGaN, and so on. There is currently considerable interest in fabricating semiconductor light-emitting devices in the (Al,Ga,In)N material system since devices fabricated in this system can emit light in the blue-violet wavelength range of the spectrum (corresponding to wavelengths in the range of approximately 380-450 nm).

Figure 1:
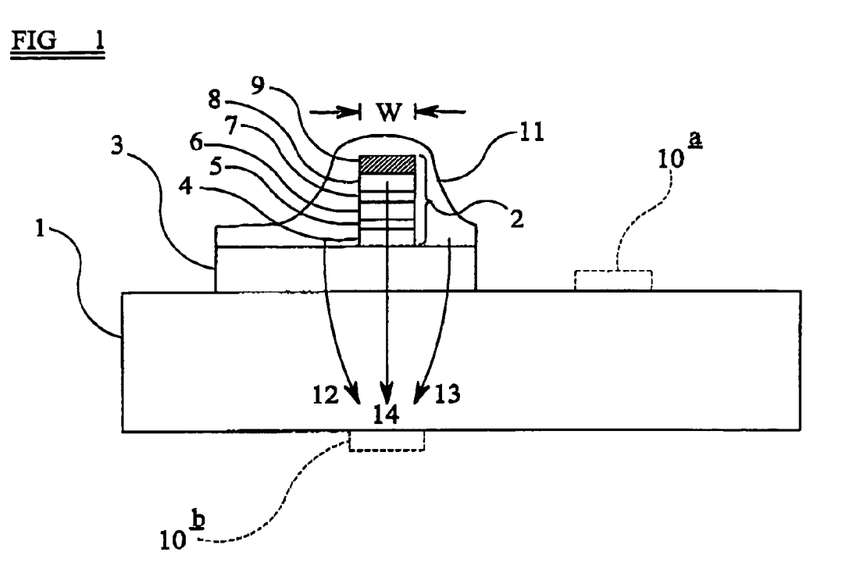
FIGS. 1 and 2 are schematic sectional views of prior art laser devices.

FIG. 1 is a schematic sectional view of a semiconductor laser device. The laser device consists of a laser structure 2 that is grown over a substrate 1. In this example, the laser device is a separate confinement (SCH) laser device and the laser structure 2 comprises, in sequence, a first cladding region 4, a first optical guiding region 5, an active region for laser oscillation 6, a second optical guiding region 7, and a second cladding region 8. A buffer layer 3 is provided between the substrate 1 and the laser structure 2. The first cladding region 4 and the first optical guiding region 5 are doped n-type, and the second cladding region 8 and the first optical guiding region 7 are doped p-type. A p-type contact layer 9 is disposed on the p-type cladding region 8. The laser further has a second, n-type contact, and this may be provided on the same surface of the substrate 1 as the laser structure (as indicated at 10a) or it may be provided on the opposite surface of the substrate 1 to the laser structure (as indicated at 10b).

The first cladding region 4, first optical guiding region 5, active region 6, second optical guiding region 7, second cladding region 8 and the contact layer 9 have been etched to a desired width w, to form a mesa. The mesa may be a ridge mesa and extend into the plane of the paper, or the mesa may have circular symmetry about the vertical axis. The width w of the mesa will be small, typically a few μm, so that the surface area of the mesa is small (particularly in the case of a circularly symmetric mesa). In order to ensure good electrical contact to the laser it is therefore conventional to deposit an electrically conductive "pad" 11 over the laser. The conductive pad 11 has a much greater surface area than the mesa, and so it is easier to make an electrical contact to the pad 11 than it is to make an electrical contact direct to the contact layer 9.

Figure 2:
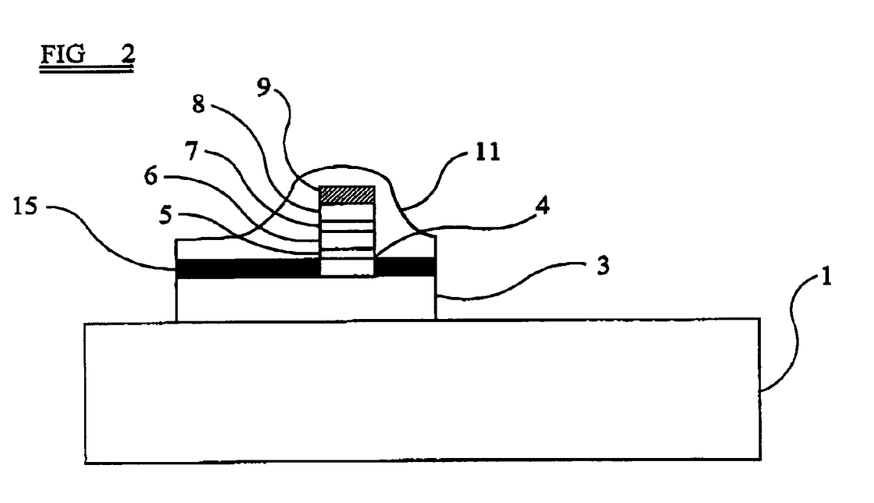

Providing the electrically conductive pad 11 directly over the laser structure, as shown in FIG. 1, has the disadvantage that the conductive pad 11 is disposed directly on the portions of the buffer layer 3 that are exposed in the step of etching to form the mesa, and so makes electrical contact with the buffer layer 3. As a result, low resistance current paths 12,13 exist that go from the electrically conductive pad 11 to the n-type contact 10a or 10b without passing through the active region 6. The current paths 12, 13 that do not pass through the active region 6 are in parallel to the desired current path 14 through the active region 6, and degrade the characteristics of the laser-current that flows along these current paths 12,13 does not contribute to laser oscillation. It is therefore usual to provide a current blocking layer 15 having a high electrical resistance between the buffer layer 3 and the conductive pad 11, as shown in FIG. 2. The laser of FIG. 2 is generally similar to the laser of FIG. 1, except for the provision of the high resistance layer 15. The high resistance layer 15 suppresses the current paths 12,13 of FIG. 1 that do not flow through the active region 6, and so improves the characteristics of the laser. The high resistance layer 15 may be, for example, a layer of silica (silicon dioxide).

Although the high resistance layer 15 improves the characteristics of the laser, providing the high resistance layer 15 does make the process of fabricating the laser significantly more complicated. The high resistance layer must not be deposited over the contact layer 9, since this would increase the resistance of the desired current path 14 through the active region 6. Depositing the high resistance layer 15 therefore requires additional etching and masking steps—in general, the insulating layer 15 is deposited over the entire buffer layer 3 and the mesa, the portions of the insulating layer that are not over the mesa are masked, and the portion of the insulating layer that overlies the mesa is then removed via an etching step.

It is known to provide the laser structure with an additional layer that can be oxidised during the growth process to form the high resistance layer 15. However, if the additional layer extends through the mesa, it will affect the bandgap profile and refractive index profile of the laser, and this is undesirable. If the additional layer is to be deposited only outside the mesa, then additional masking and etching steps are required.

ACKNOWLEDGEMENT OF THE PRIOR ART

Appl. Phys. Lett 63 (12) p 1660 (1993) "Native oxide top- and bottom-confined narrow stripe p-n AlGaAs—GaAs—InGaAs quantum well heterostructure laser," and Appl. Phys. Lett. 65 (1) p 97 (1994) "Native-oxide defined ring contact for low threshold vertical-cavity lasers" disclose laser devices in which a layer is oxidised to form a current blocking layer. Appl. Phys. Lett. 65 (1) p 97 (1994) discloses growth of a vertical cavity surface-emitting laser (VCSEL) having an AlAs layer as an intermediate layer. The layer structure is etched to define a mesa, and side edges of the AlAs layer are exposed in this etching step. An insulating ring is then formed in the mesa by lateral oxidation of the exposed side edges of the AlAs layer. Appl. Phys. Lett 63 (12) p 1660 (1993) discloses a similar process in which side edges of an AlGaAs layer with a high aluminium content ($Al_{0.85}Ga_{0.15}As$ or $Al_{0.87}Ga_{0.13}As$) are exposed when a layer structure is etched to form a mesa, and the AlGaAs is then laterally oxidised to form an insulating ring buried in the mesa. Creating buried insulating layers in this way is specific to the AlGaAs materials system.

U.S. patent application Ser. No. 2003/0052326 discloses a method of fabricating a semiconductor light-emitting device. A semiconductor layer structure is grown, having a contact layer as its uppermost layer. An antioxidising film is deposited over the upper face of the layer structure. A resist layer is deposited on the antioxidising film, and the resist is patterned to leave resist present only where it is desired to define a mesa. The antioxidising film is then etched using the resist as a mask, to leave the antioxidising film present only where it is desired to define the mesa. This is followed by a second etching step, using the resist and the antioxidising film as a mask, to define the mesa in the semiconductor layer structure.

An epitaxial layer having an aluminium mole faction of 0.15 is exposed in the second etching step. The exposed portions of this layer are oxidised in an oxygen atmosphere at 900° C. to form a current-blocking layer; the resist and the antioxidising film again act as a mask in this step. The remaining portions of the resist and the antioxidising film are then removed to expose the contact layer. Finally, the contact layer is regrown.

JP-A-2000-164 926 discloses a method of manufacture of high electron mobility transistors or laser devices. A layer structure is grown, and an $SiO_2$ mask Is deposited over the layer structure. The part(s) of the layer structure not covered by the $SiO_2$ mask are then etched to expose an underlying aluminium-containing layer within the layer structure. The exposed portions of the aluminium-containing layer are then oxidised to form an oxide film which acts as an etch-stop layer in subsequent manufacturing steps.

SUMMARY OF THE INVENTION

A first aspect of the present invention provides a method of manufacturing a semiconductor laser device, the method comprising the steps of: selectively etching a semiconductor layer structure fabricated in a nitride materials system and including an aluminium-containing region thereby to form a mesa; wherein the aluminium-containing region forms either a cladding region or an optical guiding region of the device; wherein one or more portions of the aluminium-containing region are exposed in the etching step; and wherein the method comprises oxidising the or each exposed portion of the aluminium-containing region using the mesa as a mask thereby to form a current blocking layer laterally adjacent to and extending laterally from the mesa.

In the method of the invention, the mesa defined In the semiconductor layer structure is used as a mask in the oxidising step, and prevents oxidation of the portion of the cladding layer or optical guiding layer that is contained within the mesa. This eliminates the need to provide a mask specifically for the oxidising step and to remove the mask after completion of the etching step. This reduces the number of process steps, and thus makes the method quicker and cheaper to carry out. The uppermost layer of the mesa during the oxidation step is not removed after the oxidation step and is incorporated into the finished device.

The oxidised aluminium-containing region acts, in the resultant laser device, as a current blocking layer (such as the current blocking layer 15 of the laser device of FIG. 2). Thus, the invention enables a current blocking layer to be provided adjacent to the mesa, and extending away from the mesa, without requiring that any additional layers are incorporated in the laser structure. The etching step by which the aluminium-containing cladding region or optical guiding region is exposed is the conventional etching step used to define the mesa, so that the invention does not require any additional etching steps.

Oxidation of an aluminium-containing nitride semiconductor layer has previously been reported. For example, "Enhancement of Schottky barrier height on AlGaN/GaN heterostructure by oxidation annealing", Appl. Phys. Lett 82 (24), reports oxidation of an AlGaN layer during manufacture of a field effect transistor. An exposed AlGaN layer is oxidised, and the device is then annealed to alter properties of layers under the AlGaN layer. The AlGaN layer is then removed by etching. This process increases the height of the Schottky barrier in the device. However, the oxidised AlGaN layer is not retained in the finished device.

The method may comprise the further step of depositing an electrically conductive layer over the mesa and over the or each oxidised exposed portion of the aluminium-containing region. The electrically conductive layer forms the contact pad 11 of the laser of FIG. 2.

The uppermost layer of the layer structure may not contain aluminium. This makes it easier to provide a high-quality electrical contact on the layer structure.

The device may be fabricated in the (Al,Ga,In)N materials system.

The aluminium-containing region may have an average aluminium mole fraction of 0.1 or lower, and may have an average aluminium mole fraction of 0.07 or lower. Thus, when the invention is applied to the (Al,Ga,In)N materials system for example, x in the general formula $Al_xGa_yIn_{1-x-y}N$ for the aluminium-containing region satisfies x<0.1 and preferably satisfies x<0.07. An aluminium-containing region of a semiconductor device fabricated in a nitride materials system will typically have an aluminium mole fraction in the range from 0.05 to 0.1 since, if the aluminium content were significantly greater than 0.1 it is likely that cracks would occur in the device as a result of strain set up within the layer structure. An aluminium mole fraction of 0.1 is very much lower than the aluminium mole fractions of the AlGaAs or AlAs layers that are oxidised in the prior art methods described above. Oxidation of a layer with an aluminium mole fraction of 0.1 in an arsenide based materials system would not lead to particularly high electrical resistance.

The aluminium-containing region may be an AlGaN layer.

The step of oxidising the exposed portion of the aluminium-containing region or the may comprise a wet oxidation step. For example, the oxidation step may be performed using steam ("wet oxidation") at a temperature of approximately 500° C., and this is easier to carry out than oxidation in a oxygen atmosphere at a temperature of 900° C.

The step of oxidising the exposed portion of the aluminium-containing region may be carried out at a temperature of at least 100° C., or at a temperature of at least 450° C.

The step of oxidising the exposed portion of the aluminium-containing region may have a duration of at least one minute. It may have a duration of at least one hour.

The aluminium-containing cladding may be an optical guiding region.

The method may further comprise depositing an electrically insulating material on the or each oxidised exposed portion of the aluminium-containing region. The current blocking layer is formed by the combination of the electrically insulating material and the oxidised portion of the aluminium-containing region, and so provides improved electrical insulation.

A second aspect of the invention provides a semiconductor laser device manufactured by a method of the first aspect.

A third aspect of the present invention provides a semiconductor laser device fabricated in a nitride materials system and comprising an aluminium-containing region; wherein a first portion of the aluminium-containing region constitutes a cladding region or an optical guiding region of the semiconductor light-emitting device and is disposed in a mesa; and wherein a second portion of the aluminium-containing region has been oxidised to form a current blocking layer that is laterally adjacent to and extends laterally from the mesa.

The device may further comprise an electrically conductive layer provided over the mesa and over the second portion of the aluminum-containing region.

The uppermost layer of the mesa may not contain aluminium.

The device may be fabricated in the (Al,Ga,In)N materials system.

The aluminium-containing region may have an average aluminium mole fraction of 0.1 or lower.

The aluminium-containing region may have an average aluminium mole fraction of 0.07 or lower.

The aluminium-containing region may be an AlGaN region.

Preferred embodiments of the present invention will now be described by way of illustrative example with reference to the accompanying figures in which:

Like reference numerals denote like components throughout the specification and drawings.

Figure 4A:
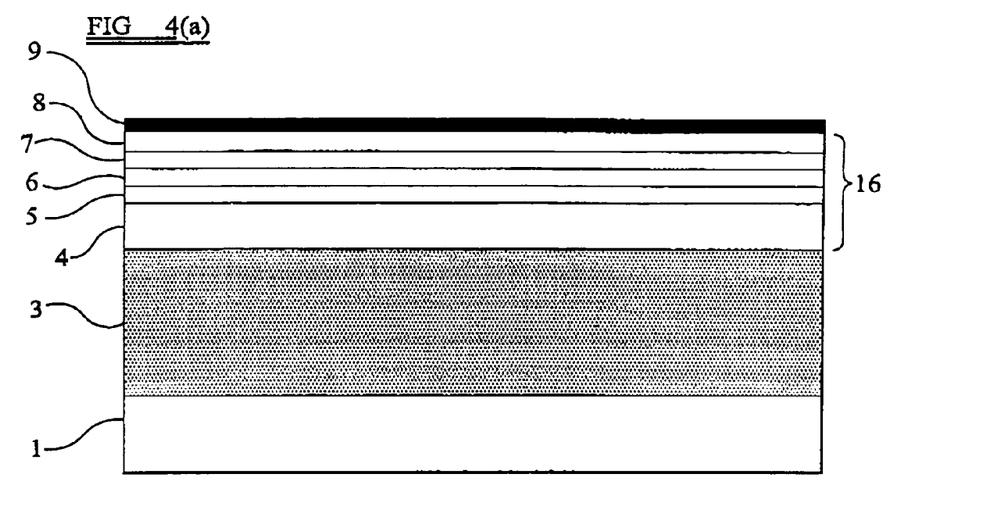
FIGS. 4(a) to 4(d) illustrate the manufacture of a semiconductor laser device according to a first embodiment of the present invention.
Figure 4B:
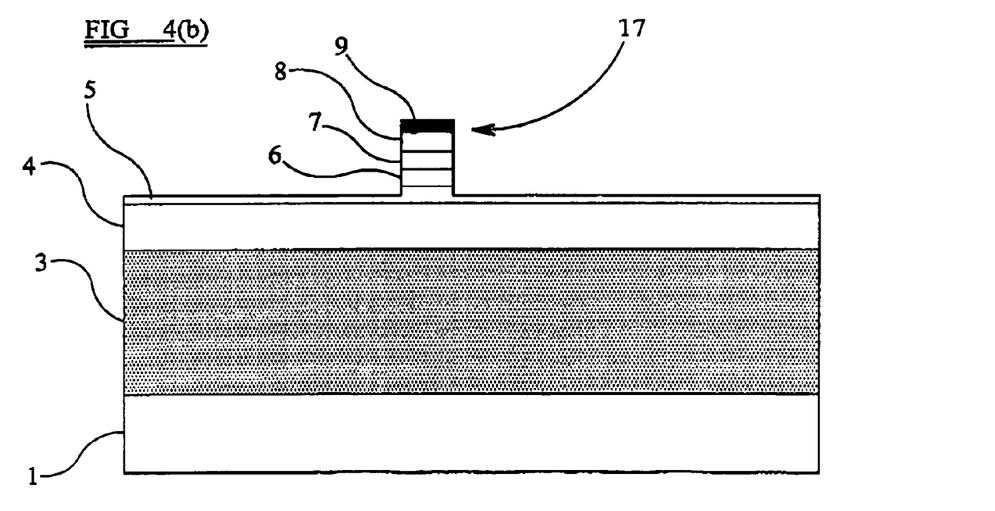
Figure 4C:
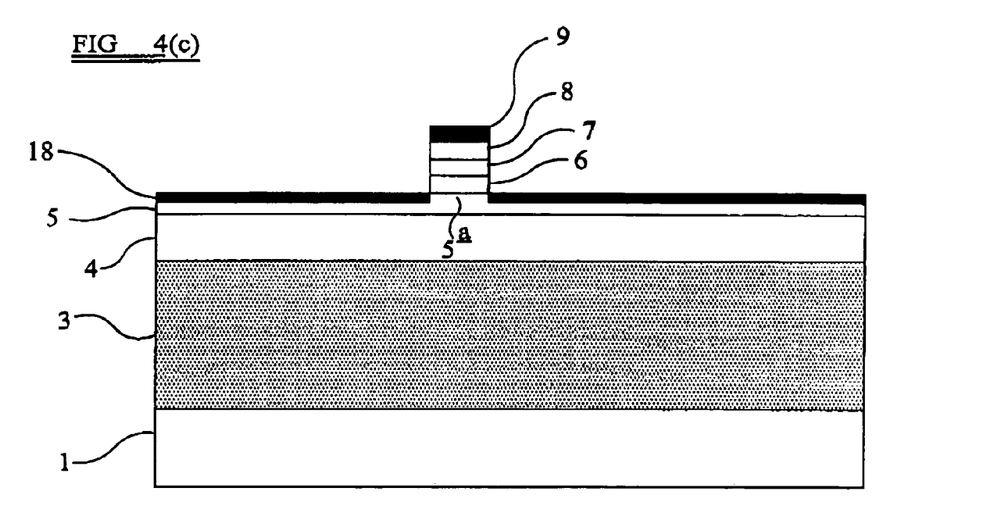
Figure 4D:
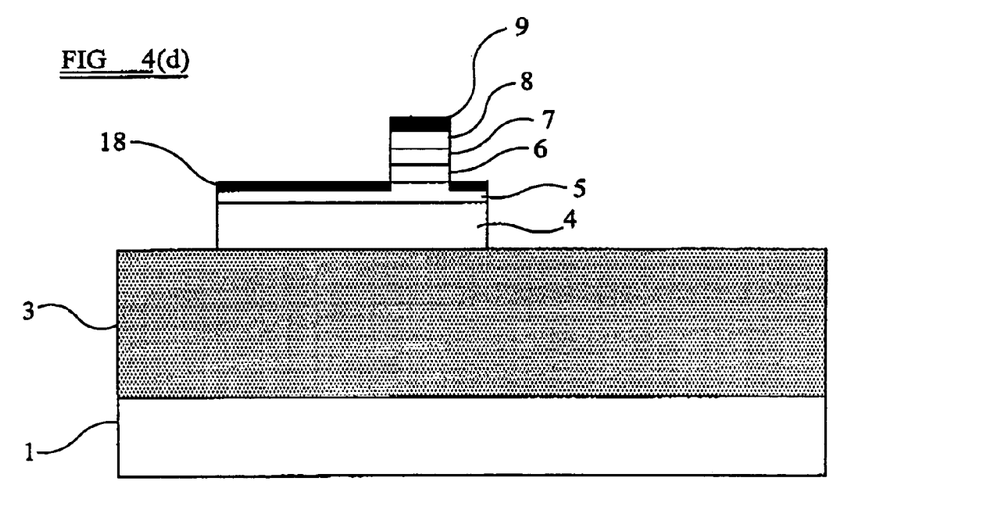
Figure 4E:
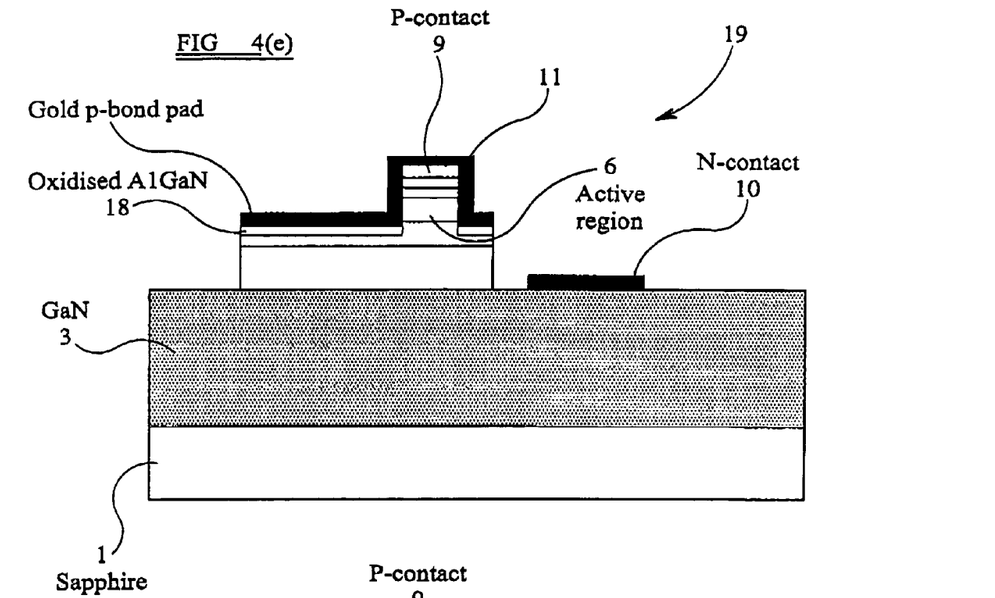
FIG. 4(e) is a schematic sectional view of a semiconductor laser device according to the first embodiment of the present invention.

FIG. 4(e) illustrates a laser device according to a first embodiment of the present invention. FIGS. 4(a) to 4(d) illustrate the manufacture of the laser device of FIG. 4(e).

Initially, as shown in FIG. 4(a), a semiconductor layer structure 16 is deposited over a substrate 1. A buffer layer 3 may be provided between the substrate 1 and the layer structure 16. The layer structure may be any suitable layer structure for producing a semiconductor laser device, and in this example includes a first cladding region 4, a first optical guiding region 5, an active region 6 for laser oscillation, a second optical guiding region 7 and a second cladding region 8 disposed in this order over the buffer layer 3. The first cladding region 4 and the first optical guiding region 5 are doped to have a first conductivity type, and the second cladding region 8 and the second optical guiding region 7 are doped to have a second conductivity type opposite to the first conductivity type.

The first cladding region 4, the first optical guiding region 5, the active region 6, the second optical guiding region 7 and the second cladding region 8 are each shown as a single layer in FIG. 4(a) for convenience but, as is well-know, one or more of these regions may comprise two or more semiconductor layers.

According to the present invention, the layer structure 16 is fabricated in a nitride materials system, and at least one of the cladding regions 4,8 or the optical guiding regions 5,7 is an aluminium-containing region.

In the embodiment of FIG. 4(a), the semiconductor laser device is fabricated in the (Al,Ga,In)N materials system. In this materials system, examples of suitable material compositions for the regions are as follows:

substrate: sapphire;
buffer layer 3: n-type GaN;
first cladding region 4: n-type GaN;
first optical guiding region 5: n-type AlGaN;
second optical guiding region 7: p-type AlGaN; and
second cladding region 8: p-type GaN.

The active region 6 may have any suitable structure, but will in general consist of at least one quantum well layer and at least one barrier layer.

In this structure, the uppermost layer (the second cladding region 8) does not intentionally contain aluminium. This is preferable, since it can be difficult to make a good-quality electrical contact to an aluminium-containing nitride semiconductor layer. Moreover, the uppermost layer will not be oxidised in the oxidation step to be described below if it does not contain aluminium (although since the uppermost layer will be covered by a metallic contact layer and so will not be exposed in the oxidation step this point is of lesser importance).

A contact layer 9 is deposited over the semiconductor layer structure 16. The contact layer 9 will ultimately form the upper contact to the laser (corresponding to the contact 9 of the laser shown in FIG. 2), and may be a metallic layer such as, for example, a mixed layer of nickel and gold. In a preferred embodiment, the contact layer 9 is formed by depositing a layer of nickel over the layer structure 16 and subsequently depositing a layer of gold over the layer of nickel. In this embodiment, examples of suitable thicknesses are 15 nm for the nickel layer and 25 nm for the gold layer. It is preferable for the contact 9 to have a gold layer as its uppermost layer, since a gold layer will not be oxidised in the oxidation step to be described below.

The semiconductor layer structure 16 and the contact layer 9 are then patterned to form a mesa 17, as shown in FIG. 4(b). The layers are patterned at least down to and including the active region, so that the mesa includes at least a portion of the contact layer 9, a portion of the second cladding region 8, a portion of the second optical guiding region 7 and a portion of the active region 6.

In FIG. 4(b) the patterning step is shown as patterning the metallic layer 9, the second cladding region 8, the second optical guiding region 7 and the active region 6, so that the first optical guiding region 5 is partially exposed. In general it will be difficult to stop the etching process immediately the first optical guiding region 5 is exposed, so it is likely that part of thickness of the first optical guiding region 5 will be removed in the etching step, as shown in FIG. 4(b). The width of the mesa structure will typically be a few microns, and is preferably approximately 5 ì m. The mesa may be a ridge mesa and extend into the plane of the paper in FIG. 4(b), so as to provide a ridge laser.

Thus, according to the invention, the step of forming the mesa structure also results in the exposure of one or more portions of an aluminium-containing region of the layer structure. The or each exposed portion of the aluminium-containing region is laterally adjacent to, and extends laterally from, the mesa. In the example of FIG. 4(b), the first optical guiding region 5, which in this example is an AlGaN layer, has been exposed.

The mesa 17 may be formed by any suitable process, for example by masking the part of the layer structure that corresponds to the desired mesa 17, and then etching the layer structure to remove the un-masked material. The masking step may use a conventional photolithographic technique of depositing a layer of photoresist over the layer structure, and removing photoresist from those areas of the layer structure that are to be etched leaving only a photoresist mask present over the intended site of the mesa 17. In general, the patterning will require two etching steps—a first etching step to etch the contact layer 9 and a second etching step to etch the semiconductor layer structure.

Next, the exposed portion(s) of the aluminium-containing layer is/are oxidised to form a layer having a high electrical resistance. The oxidation step may be carried out by, for example, placing the sample in a wet oxidation rig, and exposing the sample to steam at a temperature of at least 100° C. for at least one minute. The result of the oxidation step is that a high resistance aluminium oxide layer 18 is formed at the upper surface of the aluminium-containing layer, where this was exposed in the etching step. The high resistance aluminium oxide layer is laterally adjacent to the mesa, and extends away from the mesa. The portion 5a of the aluminium-containing region 5 within the mesa 17 is not oxidised in this step, because the mesa acts as a mask during the oxidation step. FIG. 4(c) shows the sample after the oxidation step has been carried out. Furthermore, lateral oxidation of the layer 5 will not occur to any significant amount, owing to the relatively low aluminium content of the layer 5. Since the mesa 17 acts as a mask during the oxidation step it is not necessary to provide any mask specifically for the oxidation step. This avoids the need to provide the mask and to remove it after the oxidation step has been carried out. The uppermost layer of the mesa during the oxidation step (the metallic contact layer 9 in the example of FIGS. 4(a) to 4(d)) is not removed after the oxidation step and is incorporated into the finished device.

The depth to which the exposed portion(s) of the aluminium-containing region is/are oxidised will depend on the duration and conditions of the oxidation step, and also on the aluminium content of the aluminium-containing region. As is explained below, the low aluminium content of the aluminium-containing region in the present invention makes it unlikely that the aluminium-containing region will be oxidised throughout its complete depth.

The sample is then subjected to a second etching step. In the second etching step, portions of the oxide layer 18 and the layers of the layer structure below the oxide layer 18 are removed, down to the buffer layer 3. The regions of the layers removed in the second etching step are defined by a second masking step carried out before the second step. The second masking step and second etching step may again be any suitable combination of masking and etching steps, and the second masking step may again be carried out by photolithography. The structure produced by this second etching step is shown in FIG. 4(d). The lower cladding region is shown in FIG. 4(d) as having been completely removed to expose the buffer layer 3 although in this embodiment, since the lower cladding region 4 and the buffer layer are both formed of n-type GaAs, it is not necessary for the lower cladding region 4 to be completely removed.

In manufacture of a ridge laser, the laser facets are defined in the second etching step.

The depths to which the layers are etched in the first and second etching steps are controlled by suitably controlling the duration of the etching steps. In one embodiment Electron Cyclotron Resonance (ECR) etching is used with 4 sccm $Cl_2$, 15 sccm $SiCl_4$, 6 sccm $SF_6$ and 15 sccm Ar. (The notation "sccm" means that the flow rate is equivalent to a flow rate of 1 cubic centimeter per minute under standard conditions of 0° C. and 1 atmosphere pressure.)

An electrically conductive contact layer 11 is then disposed over the mesa and over the oxidised layer 18, so that it makes electrical contact with the contact 9. The conductive layer 11 forms a bond pad that is electrically connected to the contact 9. It is possible to make electrical connection to the laser device via the contact layer 11. The conductive layer 11 may conveniently be a metallic layer such as, for example, a layer of gold.

Finally, a second contact 10 is provided, to form the complete laser device shown in FIG. 4(e). The contact 10 forms an n-type contact to the laser device and may be, for example, a titanium/aluminium contact. In this embodiment the second contact 10 is deposited on the exposed surface of the buffer layer 3, but it may alternatively be deposited on the underside of the substrate 1. The deposition of the conductive contact layer 11 and the n-type contact 10 may be carried out using any suitable technique. If necessary, the structure may be annealed after deposition of the conductive contact layer 11 and the n-type contact 10.

In the laser device 19 of FIG. 4(e), the oxide layer 18 formed by oxidising part of an aluminium-containing layer has a low electrical conductivity, and thus acts as the current blocking layer 15 shown in the laser device of FIG. 2. It prevents direct contact between the conductive contact layer 11 and the buffer layer 3. The invention therefore eliminates the need to provide an additional layer in the layer structure 16 specifically to form a current blocking layer. Furthermore, the part of the aluminium-containing region that is covered by the mesa structure 17 is not exposed in the first etching step, and so is not oxidised in the oxidation step. The current blocking layer therefore does not extend into the mesa structure 17, so that the electrical characteristics of the laser device are unaffected.

FIGS. 6(a) to 6(k) illustrate steps of the method of FIGS. 4(a) to 4(e) in more details.

Initially the semiconductor layer structure 16 is grown (the individual layers of the layer structure 16 are not shown in FIGS. 6(a) to 6(k)), and the metallic contact layer 9 is deposited over the uppermost layer of the layer structure 16 as shown in FIG. 6(a) (which corresponds to FIG. 4(a)). When the metallic layer 9 is deposited the semiconductor layer structure has not undergone etching or patterning steps, so that the upper surface of the layer structure 9 is a very clean surface. This allows a high quality contact to be made. In contrast, in methods where a metallic contact layer is deposited on a surface that has undergone etching and patterning steps it can be difficult to make a high quality contact, owing to residual contamination of the surface.

Next, masking material 22 is deposited where it is desired to form a ridge mesa as shown in FIG. 6(b). This may be done by, for example, depositing a layer of photoresist over the metallic layer 9, and exposing the photoresist to light through a suitable mask. FIG. 6(b) shows the formation of two ridge mesas, but the method is not limited to this.

Next, the metallic layer 9 is etched to remove the metallic contact layer except for the portions of the metallic layer 9 that are covered by the masking material. The result of this etching step is shown in FIG. 6(c).

Next, the semiconductor layer structure 16 is etched to define one or more ridge mesas 17. As described above, an aluminium-containing layer of the semiconductor layer structure 16 is exposed in this etching step. The masking material 22 is then removed, to give the structure shown in FIG. 6(d) (which corresponds generally to FIG. 4(b)).

Any suitable etchants may be used in the etching steps of FIGS. 6(c) and 6(d). In principle the metallic contact layer and the semiconductor layer structure 16 could be etched in a single step, but in practice better results are obtained by using different etchants in the two etching steps.

Next, the portions of the aluminium-containing layer that were exposed in the second etching step are oxidised to form an oxide layer 18 as shown in FIG. 6(e) (which corresponds generally to FIG. 4(c)). The or each ridge mesa structure 17 acts as a mask in the oxidation step, and there is no need to provide a mask specifically for the oxidation step.

Next, as shown in FIG. 6(f), masking material 23 is deposited where it is desired to form mesa structures. This may again be done by, for example, depositing a layer of photoresist and exposing the photoresist to light through a suitable mask.

Figure 6:
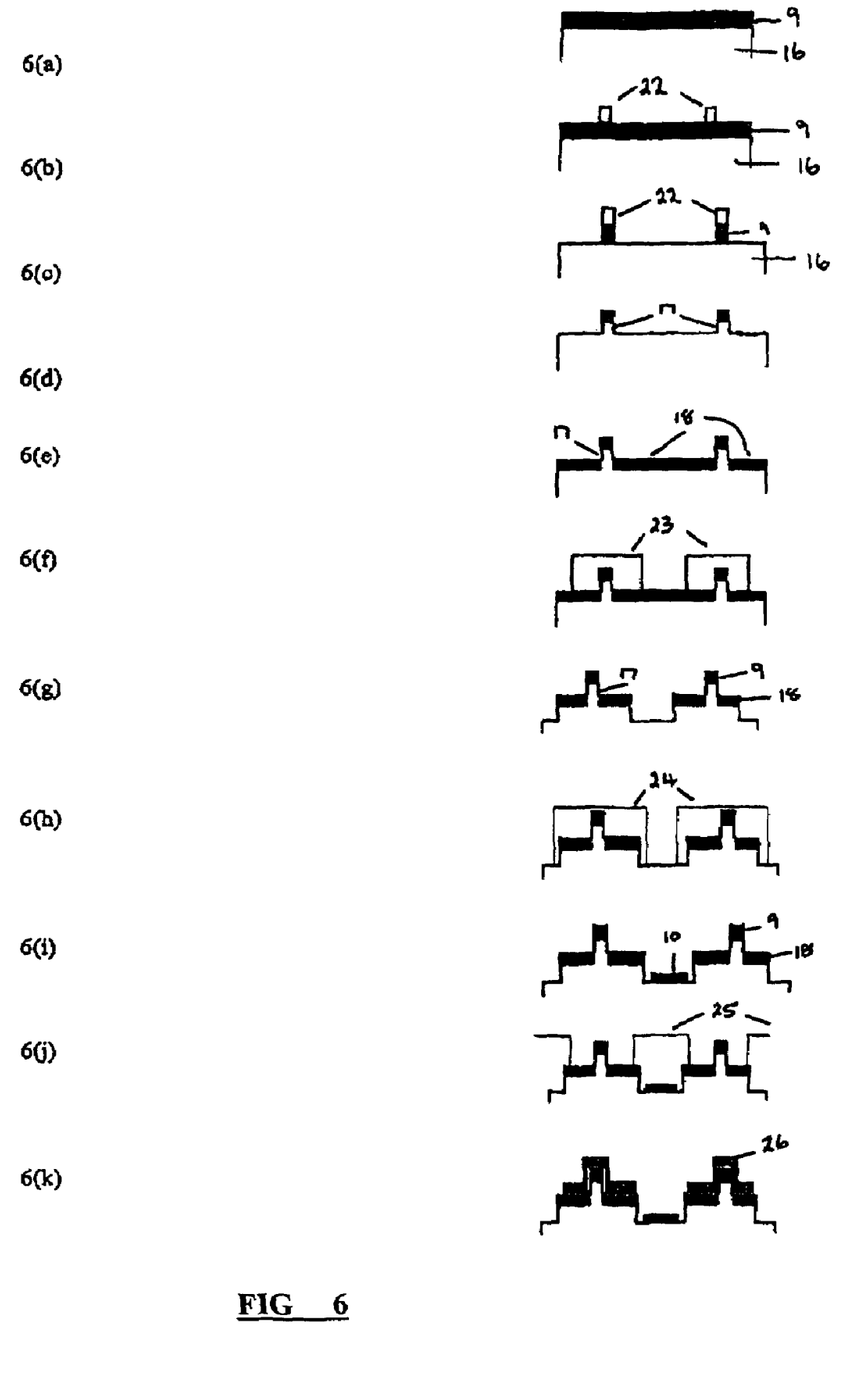
FIGS. 6(a) to 6(k) illustrate steps of the method of FIGS. 4(a) to 4(e) in more detail.

Next, the semiconductor layer structure 16 is etched to define one or more mesas. As described above, the semiconductor layer structure 16 may be etched down to the buffer layer in this etching step. The masking material 23 is then removed, to leave the structure shown in FIG. 6(*g*) (which corresponds to FIG. 4(*d*)).

Next, as shown in FIG. 6(*h*), masking material 24 is deposited in regions where it is not desired to deposit the n-contact 10. This may again be done by, for example, depositing a layer of photoresist and exposing the photoresist to light through a suitable mask. A metallic layer is then deposited over the regions not covered by the masking material 24 to form the n-contact 10, and the masking material 24 is then removed to give the structure shown in FIG. 6(*i*).

Next, as shown in FIG. 6(*j*), masking material 25 is deposited over the n-contact 10. This may again be done by, for example, depositing a layer of photoresist and exposing the photoresist to light through a suitable mask. The remaining portions of the metallic layer 9 and most of the oxide layer 18 are not covered by the masking material 25.

Finally, a metallic layer 26, for example a gold layer, is deposited where the masking material 25 is not present. The metallic layer forms one or more bond pads, with each bond pad being electrically connected to one portion of the metallic contact layer 9. The masking material 25 is then removed, to give the structure shown in FIG. 6(*k*), which corresponds to FIG. 4(*e*).

The resistance of the oxide layer 18 depends on the duration of the oxidation step, and on the temperature at which the oxidation step is carried out. This is illustrated in FIG. 3.

Figure 3:
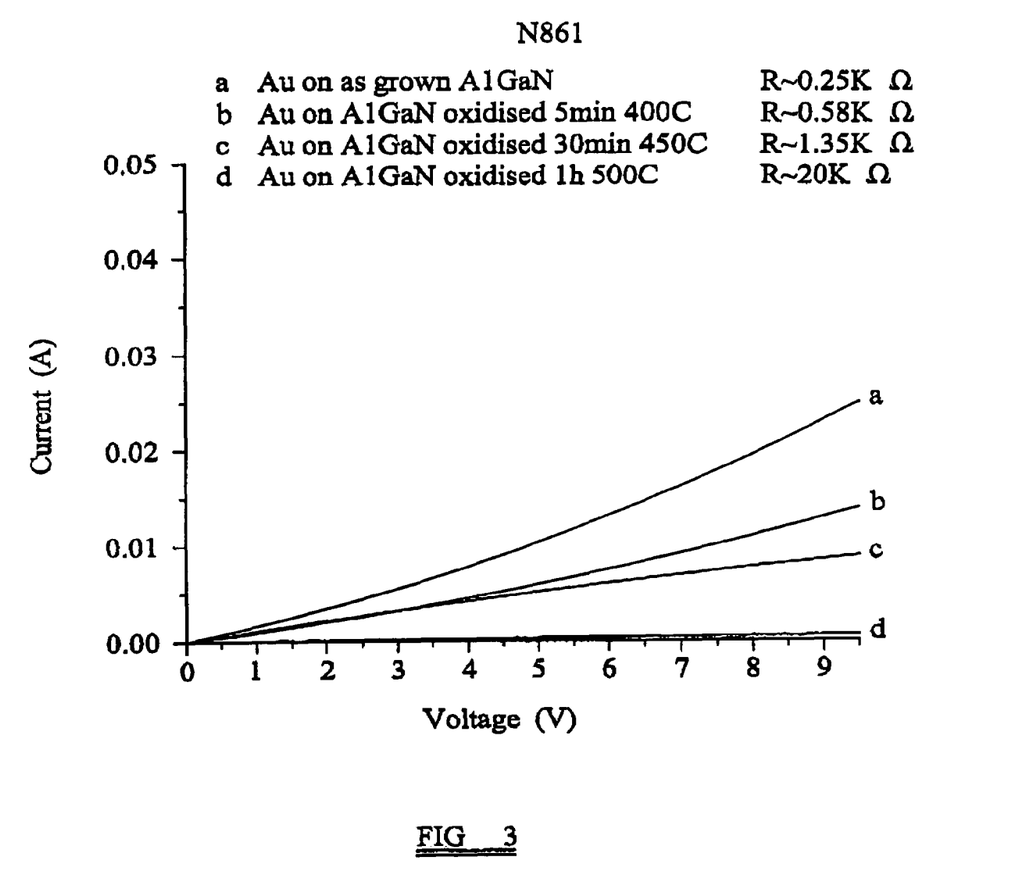
FIG. 3 shows current-voltage characteristic curves for oxidised AlGaN layers.

FIG. 3 shows current-voltage characteristic curves for an AlGaN wafer. Curve (a) in FIG. 3 is the current-voltage characteristic curve of the AlGaN wafer as grown, and this characteristic curve shows that the resistance of the AlCaN wafer is approximately 250 ohms.

Curve (b) shows the current-voltage characteristics for the AlGaN wafer of FIG. 3(*a*) after it had been oxidised using a wet oxidation step having a duration of five minutes and carried out at a temperature of 400° C. This oxidation step increased the resistance of the wafer to approximately 580 ohms.

Curve (c) in FIG. 3 shows the current-voltage characteristic curve for the AlGaN wafer of FIG. 3(*a*) after a wet oxidation step having a duration of 30 minutes and carried out at a temperature of 450° C. The effect of this oxidation step was to increase the resistance of the wafer to a resistance of approximately 1,350 ohms.

Finally, trace (d) of FIG. 3 shows the current-voltage characteristic curve for the AlGaN wafer of FIG. 3(*a*) after a wet oxidation step having a duration of one hour and carried out at 500° C. It can be seen that this oxidation step increased the resistance of the wafer to approximately 20,000 ohms—that is, the oxidation step has increased the resistance of the wafer by a factor of approximately 80.

FIGS. 3(*a*) to 3(*d*) were obtained using a wafer having an aluminium content of 0.08.

Thus, by suitably choosing the duration and temperature of the oxidation step, it is possible to increase the resistance of the oxidised regions 18 to a value desired to form a current blocking layer. The maximum resistance that can be obtained corresponds to complete oxidation of the aluminium-containing layer throughout its entire depth. However, when the present invention is applied to a nitride materials system, such as the (Al,Ga,In)N materials system, the aluminium content of the layer is likely to be too low to allow oxidation of the layer through its entire depth.

An aluminium-containing region of a laser device fabricated in, for example, the (Al,In,Ga)N materials system will typically have an average aluminium mole fraction of 0.05-0.1. (In the case of a region that is formed by layers having two or more different aluminium mole fractions, the "average aluminium mole fraction" is given by the average of the different aluminium mole fractions weighted by the thicknesses of the respective layers; in a simple case where layers having zero aluminium mole fraction alternate with layers having an aluminium mole fraction of, for example, 0.14, the average aluminium mole fraction will be 0.07 if the layers are all of the same thickness as one another.) If the average aluminium content is significantly greater than 0.1, it is likely that cracks will occur in the layer structure as a result of the strain set up within the layer structure. An average aluminium content of approximately 0.1 thus represents a practical upper limit to the aluminium content of the aluminium-containing layer when the invention is applied to the (Al,Ga,In)N materials system or another nitride materials system. While the inventors have found that semiconductor layers having such an average aluminium concentration can readily be oxidised to form the insulating layer 18, so that the present invention is applicable to the manufacture of many laser devices, it is unlikely that a layer having an average aluminium content of 0.1 or below will be oxidised throughout its entire depth in the oxidation step.

As noted above, the duration and temperature of the wet oxidation step may be selected so as to provide a desired resistance for the oxidised layer 18. In general, an oxidation temperature of at least 100° C. and a duration for the wet oxidation step of at least 1 minute, will be required in order to provide an oxidised layer having a suitable resistance. In a preferred embodiment, the wet oxidation step is carried out at a temperature of at least 400° C., and particularly preferably at a temperature of over 450° C. In tests carried out using an oxidation rig that provided a maximum oxidation temperature of approximately 500° C., good results were obtained using an oxidation step carried out at a temperature of between 450° C. and 500° C. and having a duration of at least one hour. As shown in FIG. 3, this will provide an oxidised layer that has a high resistance and so acts as an effective current blocking layer. However, it is expected that an oxidation temperature of over 500° C. can be used (although it is of course necessary that the oxidation temperature used is not so high as to adversely affect other layers of the layer structure 16).

Figure 5:
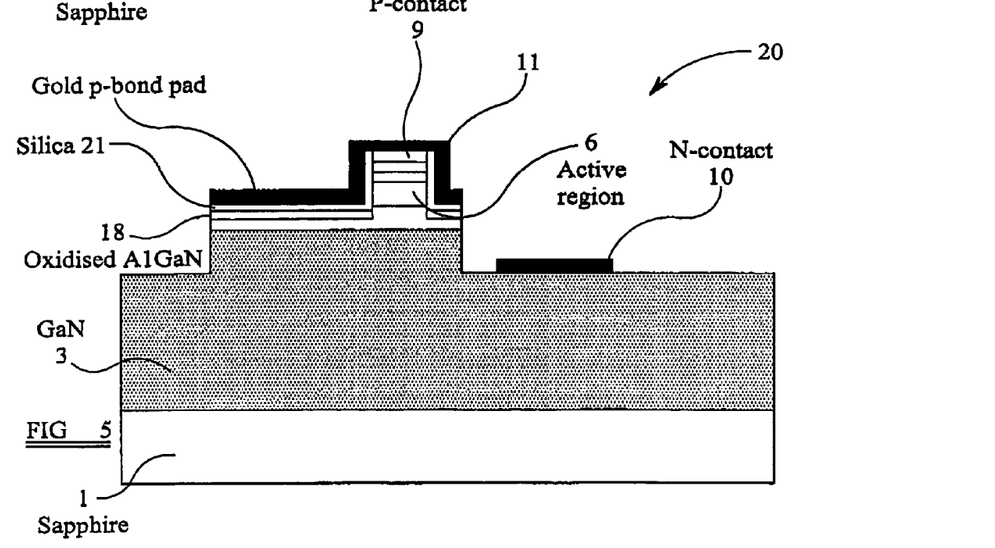
FIG. 5 is a schematic sectional view of a semiconductor laser device according to a second embodiment of the present invention.

FIG. 5 shows a laser device 20 according to a second embodiment of the present invention. The laser device of this embodiment is generally similar to the laser device of the first embodiment, except that it further comprises a second electrically insulating layer 21 disposed over the oxidised layer 18. The electrically insulating layer 21 also extends over the side faces of the ridge structure 17. The electrically insulating layer 21 is deposited over the oxidised layer 18 before the electrically conductive contact layer 11 is deposited.

In the laser device of this embodiment, the current blocking layer is formed by the combination of the insulating layer 21 and the oxidised layer 18. The current blocking layer of this embodiment will therefore have a higher resistance than if the current blocking layer were formed of only the oxidised layer 18. In most cases it will not be necessary to provide the insulating layer 21, but when the invention is applied to device where a very high resistance current blocking layer is required it may be desirable to provide the insulating layer 21.

The use of a current blocking layer that contains layers of two different materials has a further advantage, in that it is less likely to fail as a result of operation of the device. In order for the current blocking layer to break down completely, both the oxidised layer and the insulating layer must break down—and the probability of both layers breaking down is much less than the probability of a single one of the layers breaking down.

Compared to the embodiment of FIG. 4(e), the embodiment of FIG. 5 requires a further fabrication step, namely the step of depositing the insulating layer 21. The step of depositing the insulating layer is carried out after the step of oxidising the exposed aluminium-containing layer, but before the second etching step. That is, the aluminium-containing layer would be exposed and oxidised to give the structure shown in FIG. 4(c), and the insulating layer would then be deposited over the structure. The second etching step would then be carried out to give the structure shown in FIG. 4(d) but also having the insulating layer deposited over the oxidised layer 18. The subsequent steps of depositing the second contact 10 and the metallic pad 11 are the same as in the manufacture of the laser of the first embodiment.

In the examples described above, the oxidation step has been a wet oxidation step. The method of the invention is not, however, limited to this. In principle, any suitable method of oxidising the exposed aluminium-containing layer may be used such as, for example, annealing the exposed aluminium-containing layer in oxygen or a gas mixture containing oxygen (such as air), immersing the exposed aluminium-containing layer in an oxidising agent such as, for example, $H_2O_2$, or by using an oxygen-containing plasma.

In the embodiment of FIG. 5, the electrically insulating layer 21 may be formed of any convenient electrically insulating material. One suitable material is silica.

In the embodiments described above the aluminium-containing region that is exposed is below the active region (that is, is between the active region and the substrate). In principle, the invention could alternatively be carried out by exposing an aluminium-containing region that is above the active region. For example, the layer structure of FIG. 4(a) could be etched to expose the upper AlGaN optical guiding region 7 rather than to expose the lower AlGaN optical guiding region 5. Oxidation of the exposed portions of the upper AlGaN optical guiding region 7 would produce a current blocking layer that would block unwanted current paths such as the current paths 12,13 shown in FIG. 1. When applied in the manufacture of a semiconductor laser device this alternative method will lead to a gain-guided laser rather than to a ridge laser.

In the present application, specifying that the device of, for example, FIG. 4(e) is fabricated in a nitride materials system requires that the cladding regions 4,8 and the optical guiding regions 5, 7 are formed of materials that are a member of that material system. Specifying that a device is fabricated in the (Al,Ga,In)N system should be interpreted in an analogous way.

The invention claimed is:

1. A semiconductor light-emitting device manufactured by a method comprising:

selectively etching a semiconductor layer structure and a metallic layer formed on the semiconductor layer structure thereby to form a mesa, wherein the semiconductor layer structure is fabricated in a nitride materials system and includes an aluminum-containing region, the metallic layer constituting the uppermost layer of the mesa;

wherein the aluminum-containing region is either a cladding region or an optical guiding region (5);

wherein at least one portions of the aluminum-containing region is exposed in the etching step; and wherein the method comprises oxidising the at least one exposed portion of the aluminum-containing region using the mesa (17) as a mask thereby to form a current blocking layer (18) laterally adjacent to and extending laterally from the mesa; and wherein an electrically conductive layer is deposited over the mesa and directly onto the oxidised exposed portion of the aluminum-containing region.

2. A semiconductor light-emitting device fabricated in a nitride materials system and comprising an aluminum-containing region (5);

wherein a first portion of the aluminum-containing region constitutes a cladding region or an optical guiding region of the semiconductor light-emitting device, the first portion of the aluminum containing region being disposed in a mesa (17); and wherein a metallic layer constitutes the uppermost layer of the mesa;

wherein a second portion of the aluminum-containing region is oxidised to form a current blocking layer (18) that is laterally adjacent to and extends laterally from the mesa (17); and wherein an electrically conductive layer is deposited over the mesa and directly onto the oxidised exposed portion of the aluminum-containing region.

3. A device as claimed in claim 2, wherein the mesa (17) further comprises a layer not containing aluminum and formed under and in direct contact with the metallic layer of the mesa.

4. A device as claimed in claim 2, wherein the device is fabricated in the (Al,Ga,In)N materials system.

5. A device as claimed in claim 2, wherein the aluminum-containing region has an average aluminum mole fraction of 0.1 or lower.

6. A device as claimed in claim 5, wherein the aluminum-containing region has an average aluminum mole fraction of 0.07 or lower.

7. A device as claimed in claim 2, wherein the aluminum-containing region is an AlGaN region.

8. A device as claimed in claim 2, wherein the oxidised second portion (18) constitutes the current blocking layer in a completed device.

9. A device as claimed in claim 2, wherein the metallic layer comprises a layer of nickel and a layer of gold deposited on the layer of nickel.

* * * * *